United States Patent [19]

Oyama

[11] Patent Number: 5,412,612
[45] Date of Patent: May 2, 1995

[54] SEMICONDUCTOR STORAGE APPARATUS

[75] Inventor: Yukihiro Oyama, Tokyo, Japan

[73] Assignee: NEC Corporation, Tokyo, Japan

[21] Appl. No.: 87,282

[22] Filed: Jul. 8, 1993

[30] Foreign Application Priority Data

Jul. 8, 1992 [JP] Japan .................................. 4-180215

[51] Int. Cl.$^6$ ............................................. G11C 14/00
[52] U.S. Cl. .................... 365/228; 371/40.2; 371/66
[58] Field of Search ............... 365/154, 190, 226, 228, 365/229; 371/66, 40.2, 21.2

[56] References Cited

U.S. PATENT DOCUMENTS

| | | | |
|---|---|---|---|
| 4,686,652 | 8/1987 | Spence | 365/154 X |
| 4,800,533 | 1/1989 | Arakawa | 365/228 |
| 4,965,828 | 10/1990 | Ergott, Jr. et al. | 380/50 |
| 5,058,074 | 10/1991 | Sakamoto | 365/228 |
| 5,109,505 | 4/1992 | Kihara | 395/575 |
| 5,197,026 | 3/1993 | Butler | 365/104 |

Primary Examiner—Joseph A. Popek
Attorney, Agent, or Firm—Foley & Lardner

[57] ABSTRACT

A semiconductor storage apparatus is provided which can be used as a primary storage apparatus and a secondary storage apparatus and which allows both high accessibility and non-volatile storage of information. A volatile RAM section is a semiconductor memory adapted to load information to be stored and can be accessed at a high speed from the outside by way of a central control section. A non-volatile RAM section is another semiconductor memory into which information can be electrically reloaded and which does not require a power supply for holding stored contents. Under the control of a save/reload control section of the central control section, a memory mutual access control section is activated and saving/reloading of stored information is performed between the volatile RAM section and the non-volatile RAM section by a volatile RAM access control section and a non-volatile RAM access control section.

5 Claims, 3 Drawing Sheets

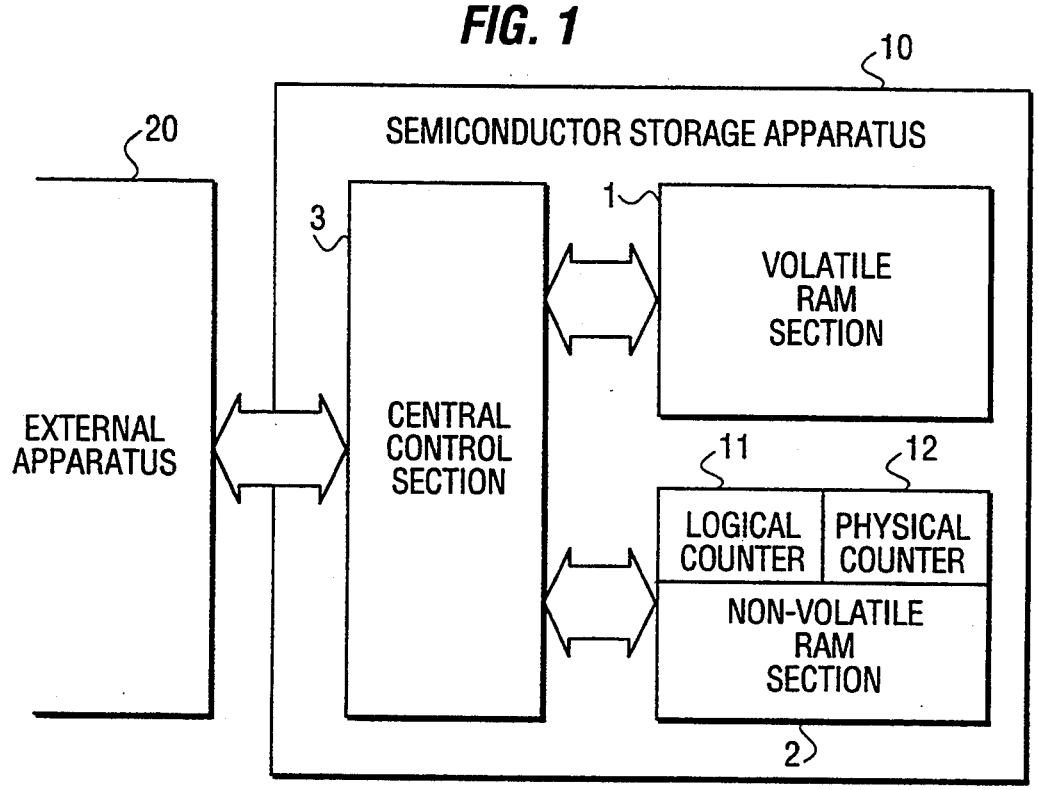
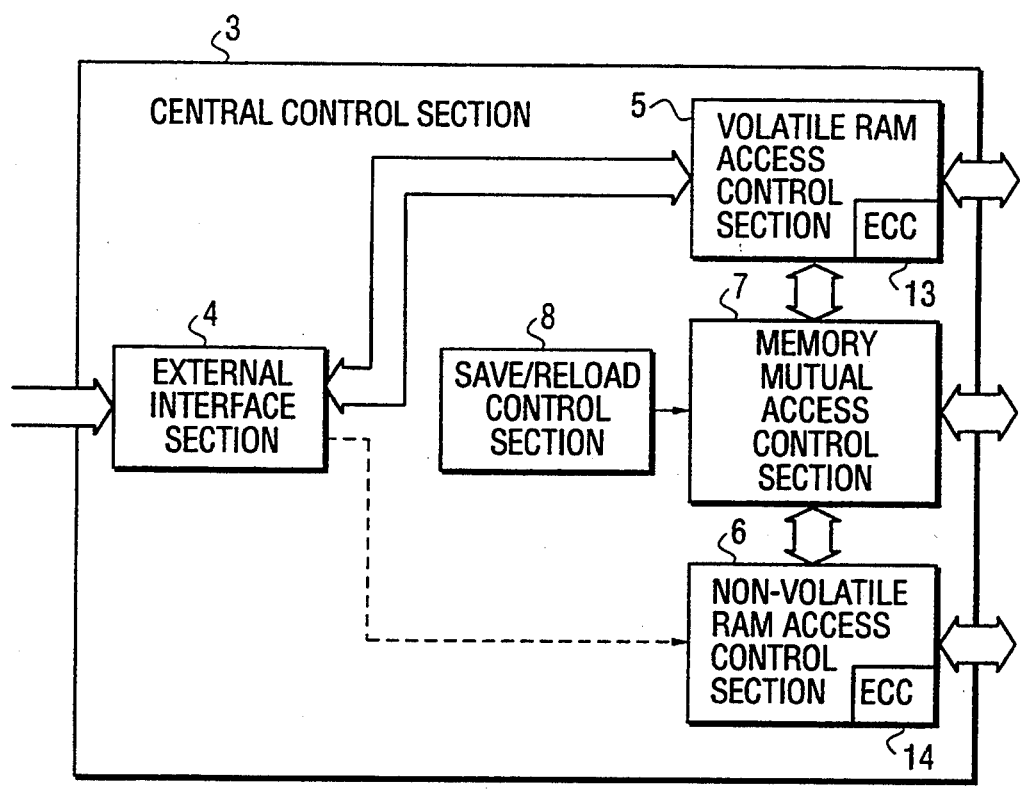

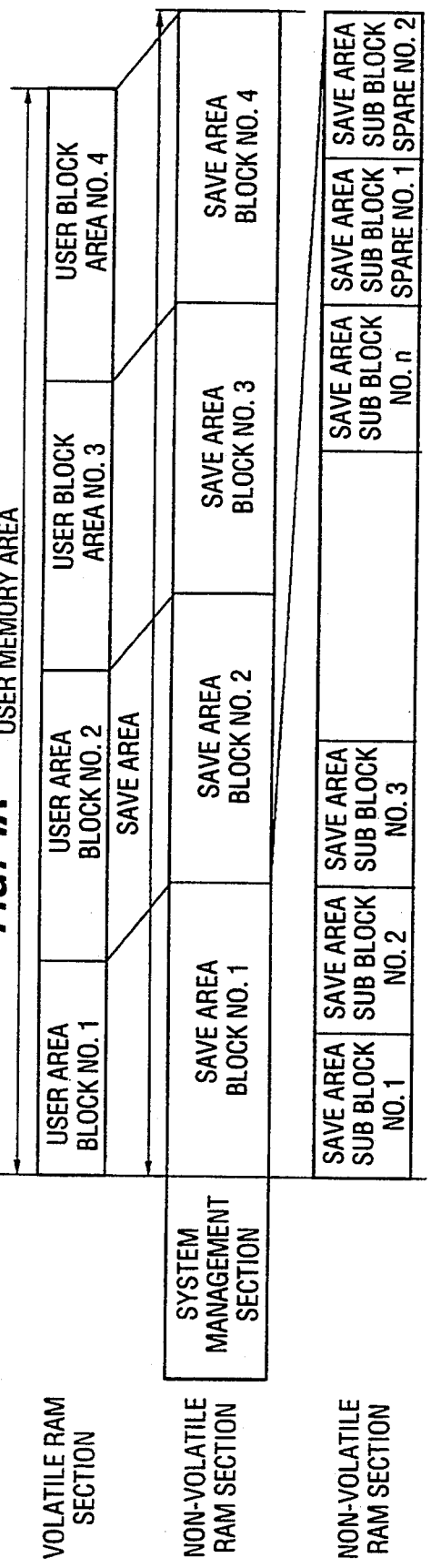
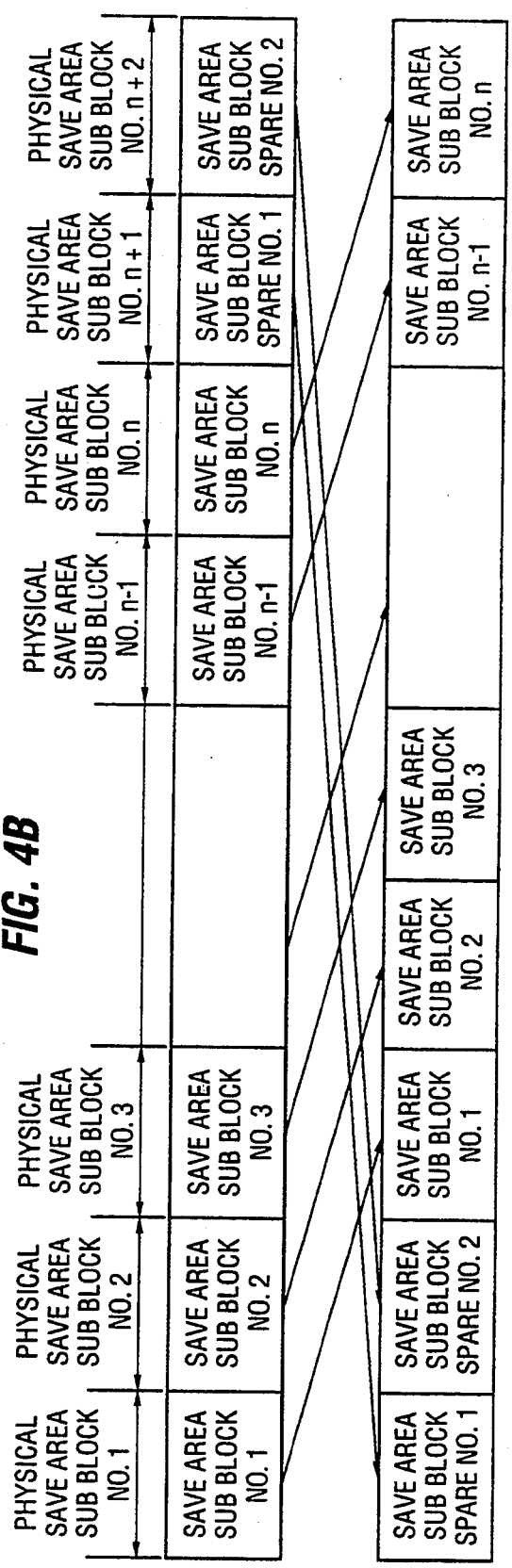
FIG. 4A
FIG. 4B

SEMICONDUCTOR STORAGE APPARATUS

BACKGROUND OF THE INVENTION

1. Field of the Invention

This invention relates to a semiconductor storage apparatus and more particularly to a storage apparatus which comprises a volatile semiconductor memory and a non-volatile semiconductor memory as a backup device for saving data.

2. Explanation of the Prior Art

Conventionally, storage apparatus used for information processing systems such as computer systems or electronic switching systems are divided into two types: primary storage apparatus constituted from a random access memory (RAM) connected to a central processing unit by way of a bus, and secondary storage apparatus such as magnetic disk apparatus, magnetic tape apparatus or optical disk apparatus for a backup purpose. Generally, a primary storage apparatus is constituted from a volatile random access memory which can be accessed directly at a high rate of speed from a central processing unit as opposed to a secondary storage apparatus having a large capacity and non-volatility and can be characterized by magnetic disk apparatus, magnetic tape apparatus, optical disk apparatus or electronic disk apparatus. The primary storage apparatus and the secondary storage apparatus have a mutually complementary relationship, and it is the current general trend to configure systems using both types of storage apparatus.

Of the conventional storage apparatus described above, the primary storage apparatus has a problem in that it requires a countermeasure to compensate for the volatility of the stored information. Of the secondary storage apparatus, those storage apparatus represented by a magnetic disk apparatus, a magnetic tape apparatus or an optical disk apparatus that require mechanical operation are disadvantageous in that a delay time caused by a mechanical operation, a seek time and a search time are involved, resulting in a low access speed. Although an electronic disk apparatus employing a semiconductor memory has a high access speed, it is disadvantageous in that a battery of large capacity is required as a countermeasure for the volatility of the stored information, resulting in an increase in weight and size and is further disadvantageous in that it requires a tertiary storage apparatus for holding the stored contents for a long period of time.

SUMMARY OF THE INVENTION

It is an object of the present invention to provide a semiconductor storage apparatus which comprises a volatile semiconductor memory as a primary storage apparatus and a non-volatile semiconductor memory as a secondary storage apparatus and, when used as a secondary storage apparatus, can be accessed at a high rate of speed substantially equal to that of a primary storage apparatus.

A non-volatile semiconductor memory used for a secondary storage apparatus employs an electrically reloadable semiconductor memory without supply of power for information storage such as flash memory.

In addition to those memory sections, a semiconductor storage apparatus of the present invention comprises a control means for read/write access control of a primary storage, a control means for read/write access control of a secondary storage, a control means for memory mutual access and copy control between a primary storage, and a secondary storage and a control means for interface control between an external apparatus and this semiconductor storage apparatus.

The present invention provides a high rate of speed for memory save and reload operation between a primary storage and a secondary storage at the time of system malfunctioning operation by the configuration mentioned above.

BRIEF DESCRIPTION OF THE DRAWINGS

The above object and features as well as the advantages of the present invention will become apparent from the following description of the preferred embodiment in conjunction with the accompanying drawings, wherein FIG. 1 is a block diagram of a semiconductor storage apparatus of an embodiment of the present invention;

FIG. 2 is a block diagram of central control section in the semiconductor storage apparatus shown in FIG. 1;

FIG. 4A is a memory block allocation diagram of a volatile RAM section and a non volatile RAM section, and their correspondence; and FIG. 4B is a similar diagram showing the round save control method when information stored in a volatile RAM section is saved into a non-volatile RAM section.

DESCRIPTION OF THE PREFERRED EMBODIMENT

Figure 3A:
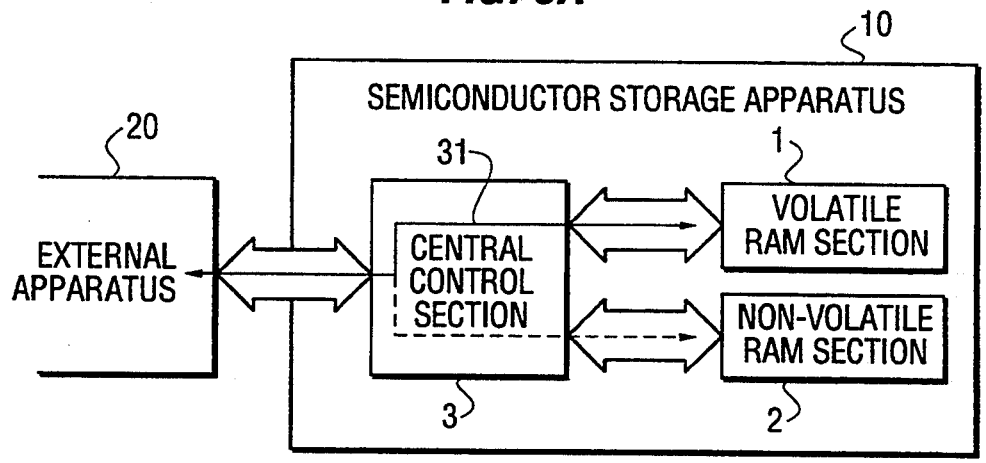
FIG. 3A is a diagrammatic view showing the external access information route when accessing a volatile RAM from the outside.

Referring to the drawings, FIG. 1 schematically shows the construction of a semiconductor storage apparatus of an embodiment of the present invention, and FIG. 2 shows the construction of a central control section 3.

The semiconductor storage apparatus 10 shown in FIG. 1 is constituted from a volatile RAM (Random Access Memory) section 1, a non-volatile RAM section 2, and a central control section 3, and is connected to an external apparatus 20. The volatile RAM section 1 is a primary storage and a semiconductor memory which can be accessed at high speed. The non-volatile RAM section 2 is a secondary storage and an electrically reloadable semiconductor memory such as flash memory which does not require a power supply for holding stored contents. The central control section 3 is constituted from an external interface section 4, a volatile RAM access control section 5, a non-volatile RAM access control section 6, a memory mutual access control section 7, and a save/reload control section 8. The external interface section 4 controls the connection to the external apparatus 20. The volatile RAM access control section 5 controls read/write access to the volatile RAM section 1. The non-volatile RAM access control section 6 controls read/write access to the non-volatile RAM section 2. The memory mutual access control section 7 controls copy between the volatile RAM section 1 and the non-volatile RAM section 2. The save/reload control section 8 controls both saving and reloading such that the memory mutual access control section 7 copies information loaded in the volatile RAM section 1 into the non-volatile RAM section 2 in response to a "save" instruction, and such that the memory mutual access control section 7 copies information loaded in the non-volatile RAM section 2 into the volatile RAM section 1 in response to a "reload" instruction.

The operation of the semiconductor storage apparatus 10 of the present embodiment will next be described.

When information to be stored is loaded from the external apparatus 20 into the semiconductor memory 10, the information to be stored and a "write" instruction are transmitted to the volatile RAM access control section 5 by way of the external interface section 4 in the central control section 3. The volatile RAM access control section 5 adds error correcting code (ECC) information via an ECC generating means 13 to the information and writes the resulting information into the volatile RAM section 1.

At the same time, the central control section 3 also transmits the "write" instruction to the non-volatile RAM access control section 6 for backup purpose by which the same information as to be written into the volatile RAM section 1 is also written into the non-volatile RAM section 2. When the stored information in the semiconductor storage apparatus 10 is to be read out to the external apparatus 20, a "read-out" instruction is transmitted to the volatile RAM access control section 5 by way of the external interface section 4 in the central control section 3. The volatile RAM access control section 5 reads out the designated information from the volatile RAM section 1 in response to the "read-out" instruction, performs error detection and correction of the information based on the error correcting code (ECC) information using an ECC decoding means 13 and transmits the resulting information to the external apparatus 20 by way of the external interface section 4. FIG. 3A shows the access information route 31 described above that is used when accessing the volatile RAM section 1 from the external apparatus 20.

Figure 3B:
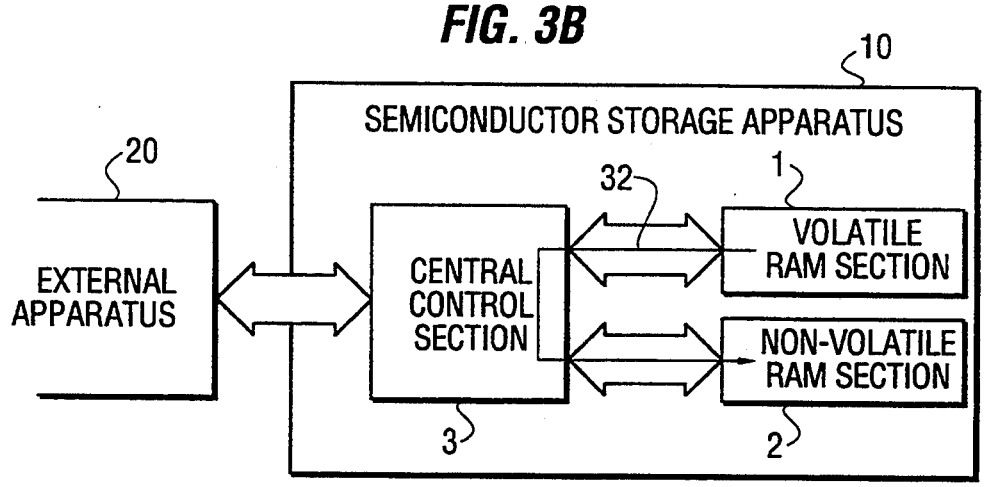
FIG. 3B is a similar view showing a saving processing information route when information loaded in a volatile RAM section of a primary storage is copied into a non-volatile RAM section of a secondary storage.

Next, when saving is to be performed by the semiconductor storage apparatus 10, the save/reload control section 8, in response to a "save" instruction, instructs the memory mutual access control section 7 to save the information loaded in the volatile RAM section 1 in the non-volatile RAM section 2. Upon reception of the instruction, the memory mutual access control section 7 delivers a "read-out" instruction to the volatile RAM access control section 5, receives the information loaded in the volatile RAM section 1, and delivers a "write" instruction to the non-volatile RAM access control section 6 to cause the non-volatile RAM section 2 to write the information. FIG. 3B shows the saving information route 32 described above when information loaded in the volatile RAM section 1 is copied into the non-volatile RAM section 2.

Figure 3C:
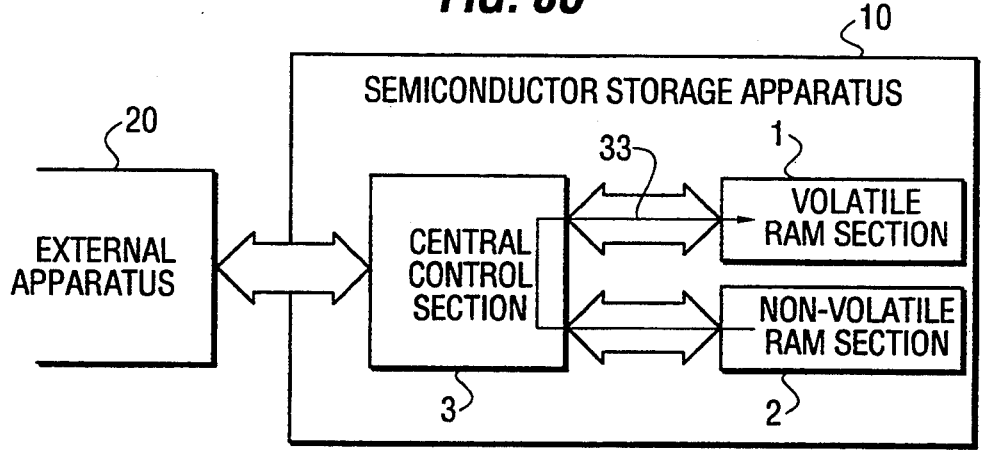
FIG. 3C is a similar view showing a reloading processing information route when information stored in a non-volatile RAM section of a secondary storage is copied into a volatile RAM section of a primary storage.

Finally, when reloading is to be performed by the semiconductor storage apparatus 10, the save/reload control section 8, in response to a "reload" instruction, instructs the memory mutual access control section 7 to perform reloading of the copied information loaded in the non-volatile RAM section 2 into the volatile RAM section 1. Upon reception of the instruction, the memory mutual access control section 7 delivers a "read-out" instruction to the non-volatile RAM access control section 6, receives the information stored in the non-volatile RAM section 2 and delivers a "write" instruction to the volatile RAM access control section 5 to cause the volatile RAM section 2 to write the information. FIG. 3C shows the reloading information route 33 described above when information loaded in the non-volatile RAM section 2 is copied into the volatile RAM section 1.

In the operation described above, some measures are taken into account for information saving into a non-volatile memory at the time of the backup write operation due to the nature of a non-volatile memory such as a flash memory. As the number of times a flash memory can be written is limited depending on the type of flash memory (for example, some types of flash memory have a limitation of 100,000 times in their life time), it is necessary to use all memory area of flash memory evenly in its writing operation.

FIG. 4A shows an example of allocation of memory area blocks and their correspondence between the volatile RAM section 1 and the non-volatile RAM section 2.

In the volatile RAM section 1, user memory area is divided into user area blocks, and each user area block is also divided into user area sub blocks whose size corresponds to the access unit such as a sector size or a block size.

In the non-volatile RAM section 2, user memory area is divided into save area blocks which correspond to user area blocks in the volatile RAM section 1, and save area sub blocks which correspond to user area sub blocks in the volatile RAM section 1. In each save area block, in addition to save area sub blocks, some spare sub blocks are contained which are used for the buffer at the time of writing operation.

When writing is to be performed from the external apparatus 20 to the semiconductor storage apparatus 10, the central control section 3 performs the backup write operation by which the same information to be written into the volatile RAM section 1 is also written into the non volatile RAM section 2.

In this backup write operation, the round save control method is employed whose explanation will next be described.

Due to a nature of the non-volatile memory such as the flash memory, each memory area of the non-volatile memory is evenly to be used as described above.

For this purpose, two types of counter are provided in the non-volatile RAM section 2. One is the logical counter 11 which counts the number of write accesses into the save area sub block (logical area of the memory), another is the physical counter 12 which counts the number of write accesses into the physical save area sub block (absolute area of the memory), and these counters are provided for each sub block.

FIG. 4B shows the philosophy of the round save control. The philosophy of the round save control is that the logical counter 11 counts up the number of write access in every time of the write access to the save area sub block and this counter value is accumulated into the corresponding physical counter 12, and then, comparing counter value accumulated in every physical counters 12, save area sub blocks are shifted to physical area whose counter value is few.

The method of save area sub block shift operation will next be described.

In this operation, number of sub blocks to be shifted is calculated.

First of all, counter 12 value of a logical counter is added to the physical counter in the area which is shifted by one sub block location, and then, sum up all added values for each logical counter 11 and physical counter 12.

Repeat this calculation for several times (for example, 16 times) by changing number of sub block location to be shifted one by one. Next, the minimum value of sum up result is to be found and the shifted value of sub block location used for the calculation of this minimum value is determined as the suitable shift value.

This suitable shift value is used to the write shift operation by which information is written into the shifted area of the save area sub block. When the accumulated value of the physical counter 12 exceeds the predetermined number, information stored in the corresponding save area block is replaced by contents of the other save area block whose accumulated value of the physical counter 12 is the minimum.

The central control section 3 controls above operation, and memory area of the non-volatile RAM section 2 is evenly used.

When the external apparatus 20 is not accessing the RAM and no saving/reloading is being performed, the volatile RAM access control section 5 controls the patrol read function. The patrol read function is a function in which data is successively read out from the volatile RAM section 1 and errors in the data are detected and corrected by the ECC decoding means 13 based on ECC information on the data.

The semiconductor storage apparatus of the present embodiment allows high speed accessing of the volatile RAM section 1 which can be used as a primary storage apparatus and a non-volatile RAM section 2 which can be used as a secondary storage apparatus by saving information from the volatile RAM section 1. In addition, the secondary storage apparatus using the non-volatile RAM section 2 has a capability of high speed access similar to that of a primary storage apparatus, thereby allowing improvement of the system performance. In contrast to conventional secondary storage apparatus, which require a long period of time for saving/reloading due to such delays as mechanical operation delay time and seek time, the semiconductor storage apparatus can perform saving/reloading in a short time because it performs saving/reloading of information at the semiconductor memory access rate using the saving control function and the reloading control function.

While a preferred embodiment of the invention has been described using specific terms, such description is for illustrative purposes only, and it is to be understood that changes and variations may be made without departing from the spirit of the following claims.

What is claimed is:

1. A semiconductor storage apparatus, comprising:
    a volatile RAM section;
    a non-volatile RAM section;
    volatile RAM access control means for controlling read/write access to said volatile RAM section;
    non-volatile RAM access control means for controlling read/write access to said non-volatile RAM section, said non-volatile RAM access control means including counters for counting a number of write accesses to each memory area of said non-volatile RAM section;
    memory mutual access control means for controlling the transfer of information loaded in said volatile RAM section into said non-volatile RAM section and vice versa;
    external interface means for connecting an external apparatus with said volatile RAM access control means;
    save control means for causing said memory mutual access control means to transfer information loaded in said volatile RAM section into said non-volatile RAM section in response to a save command from said external apparatus through said external interface means;
    reload control means for causing said memory mutual access control means to transfer information loaded in said non-volatile RAM section into said volatile RAM section in response to a reloading command from said external apparatus through said external interface means;
    central control section means for determining a memory area in which the number of write accesses is a minimum, based on values of said counters, and means for writing information into said memory area of said non-volatile RAM section when said information is transferred from said volatile RAM section into said non-volatile RAM section.

2. The semiconductor apparatus according to claim 1, wherein said volatile RAM section is in the form of a semiconductor memory read/write accessible at random from said external apparatus and said non-volatile RAM section is in the form of an electrically reloadable semiconductor memory which maintains information when power is not supplied.

3. A semiconductor storage apparatus as claimed in claim 1, wherein said volatile RAM access control means includes means for adding an error correcting code (ECC) upon writing to said volatile RAM section, means for detecting and correcting errors upon reading out from said volatile RAM section, based on the ECC, and means for successively reading out information from said volatile RAM section and detecting and correcting errors based on the ECC when there is no RAM access from said external apparatus.

4. A semiconductor storage apparatus as claimed in claim 1, wherein said non-volatile RAM access control means includes means for adding an error correcting code (ECC) upon writing to said non-volatile RAM section, and means for detecting and correcting errors upon reading out from said non-volatile RAM section, based on the ECC information.

5. A semiconductor storage apparatus, comprising:
    a volatile RAM section;
    a non-volatile RAM section;
    volatile RAM access control means for controlling read/write access to said volatile RAM section;
    non-volatile RAM access control means for controlling read/write access to said non-volatile RAM section, said non-volatile RAM access control means including counters for counting a number of write accesses to each memory area of said non-volatile RAM section; and
    control means for determining a memory area in which the number of write accesses is a minimum, based on values of said counters, so that writes to said non-volatile RAM are to said memory area.

* * * * *